United States Patent
Chen

(10) Patent No.: US 11,545,567 B2
(45) Date of Patent: Jan. 3, 2023

(54) METHODS FOR FORMING FLUORINE DOPED HIGH ELECTRON MOBILITY TRANSISTOR (HEMT) DEVICES

(71) Applicant: Vanguard International Semiconductor Corporation, Hsinchu (TW)

(72) Inventor: Chih-Yen Chen, Tainan (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 227 days.

(21) Appl. No.: 16/997,029

(22) Filed: Aug. 19, 2020

(65) Prior Publication Data

US 2020/0381544 A1 Dec. 3, 2020

Related U.S. Application Data

(62) Division of application No. 16/235,045, filed on Dec. 28, 2018, now Pat. No. 10,804,385.

(51) Int. Cl.
*H01L 29/778* (2006.01)
*H01L 29/20* (2006.01)
(Continued)

(52) U.S. Cl.
CPC ...... *H01L 29/7787* (2013.01); *H01L 21/2258* (2013.01); *H01L 21/30621* (2013.01);
(Continued)

(58) Field of Classification Search
CPC ............ H01L 29/66462; H01L 29/207; H01L 29/0638; H01L 29/7787; H01L 29/2003;
(Continued)

(56) References Cited

U.S. PATENT DOCUMENTS 8,624,296 B1 * 1/2014 Wong ............... H01L 29/7787
257/E21.403
8,895,992 B2 11/2014 Liu et al.
(Continued)

FOREIGN PATENT DOCUMENTS

JP 2018121001 A * 8/2018 ......... H01L 29/1066
TW 201242016 A1 10/2012
(Continued)

OTHER PUBLICATIONS

Taiwanese Office Action and Search Report, dated Mar. 18, 2019, for Taiwanese Application No. 107135562.

*Primary Examiner* — Alexander O Williams
(74) *Attorney, Agent, or Firm* — Birch, Stewart, Kolasch & Birch, LLP

(57) ABSTRACT

A semiconductor device includes a substrate, a channel layer, a barrier layer, a compound semiconductor layer, a source/drain pair, a fluorinated region, and a gate. The channel layer is disposed over the substrate. The barrier layer is disposed over the channel layer. The compound semiconductor layer is disposed over the barrier layer. The source/drain pair is disposed over the substrate, wherein the source and the drain are located on opposite sides of the compound semiconductor layer. The fluorinated region is disposed in the compound semiconductor layer. The gate is disposed on the compound semiconductor layer.

20 Claims, 7 Drawing Sheets

(51) Int. Cl.
*H01L 29/205* (2006.01)
*H01L 21/225* (2006.01)
*H01L 29/66* (2006.01)
*H01L 21/306* (2006.01)
*H01L 21/324* (2006.01)
*H01L 29/06* (2006.01)

(52) U.S. Cl.
CPC ...... *H01L 21/3245* (2013.01); *H01L 29/0638* (2013.01); *H01L 29/2003* (2013.01); *H01L 29/205* (2013.01); *H01L 29/66462* (2013.01)

(58) Field of Classification Search
CPC ............. H01L 21/2654; H01L 21/3245; H01L 21/30621; H01L 29/7786; H01L 21/2258; H01L 21/432; H01L 29/41766; H01L 29/778; H01L 29/20; H01L 29/205; H01L 21/225; H01L 29/66; H01L 21/306; H01L 21/324; H01L 29/06
USPC .......................................................... 257/76
See application file for complete search history.

(56) References Cited

U.S. PATENT DOCUMENTS

| | | |
|---|---|---|
| 8,900,939 B2 | 12/2014 | Kub et al. |
| 10,804,385 B2 * | 10/2020 | Chen .................... H01L 21/2258 |
| 10,825,924 B2 * | 11/2020 | Green .................... H01L 29/778 |
| 2012/0091522 A1 | 4/2012 | Ozaki et al. |
| 2012/0205662 A1 | 8/2012 | Nakamura et al. |
| 2013/0069175 A1 * | 3/2013 | Ozaki ................. H01L 29/7786 |
| | | 257/E21.409 |
| 2016/0260817 A1 | 9/2016 | Reiner et al. |
| 2019/0081167 A1 | 3/2019 | Chen et al. |
| 2019/0280112 A1 | 9/2019 | Shimizu et al. |
| 2020/0105872 A1 * | 4/2020 | Glass ................. H01L 29/78618 |

FOREIGN PATENT DOCUMENTS

| | | |
|---|---|---|
| TW | I482280-8 | 4/2015 |
| TW | I509796-8 | 11/2015 |
| TW | I515894-8 | 1/2016 |
| TW | I577009 B | 4/2017 |

* cited by examiner

METHODS FOR FORMING FLUORINE DOPED HIGH ELECTRON MOBILITY TRANSISTOR (HEMT) DEVICES

This application is a Divisional of copending application Ser. No. 16/235,045, filed on Dec. 28, 2018, which are hereby expressly incorporated by reference into the present application.

BACKGROUND

Technical Field

The embodiment of the present disclosure relates to semiconductor manufacturing, and in particular it relates to semiconductor devices and methods for forming the same.

Description of the Related Art

A high electron mobility transistor (HEMT), also known as a heterostructure field-effect transistor (HFET) or a modulation-doped field-effect transistor (MODFET), is a kind of field effect transistor (FET) made of semiconductor materials having different energy gaps. A two-dimensional electron gas (2DEG) layer is formed at the interface between two different semiconductor materials that are adjacent to each other. Due to the high electron mobility of the 2DEG, the HEMT can have high breakdown voltage, high electron mobility, low on-resistance, low input capacitance, and other advantages, and is therefore suitable for high-power components.

However, while existing HEMTs generally meet requirements, they are not satisfactory in every respect, and further improvements are needed to improve performance and have wider application.

BRIEF SUMMARY

In accordance with some embodiments of the present disclosure, a semiconductor device is provided. The semiconductor device includes a substrate, a channel layer, a barrier layer, a compound semiconductor layer, a source/drain pair, a fluorinated region, and a gate. The channel layer is disposed over the substrate. The barrier layer is disposed over the channel layer. The compound semiconductor layer is disposed over the barrier layer. The source/drain pair is disposed over the substrate. The source and the drain are located on opposite sides of the compound semiconductor layer. The fluorinated region is disposed in the compound semiconductor layer. The gate is disposed on the compound semiconductor layer.

In some embodiments, the fluorinated region extends from the top of the compound semiconductor layer into the barrier layer.

In some embodiments, the semiconductor device further includes a fluorinated region disposed in the barrier layer around the compound semiconductor layer.

In some embodiments, the semiconductor device further includes a first fluorine holding layer disposed at the top, the interior, or the bottom of the compound semiconductor layer; and/or a second fluorine holding layer covering a sidewall of the compound semiconductor layer and extending between the source/drain pair and the barrier layer.

In some embodiments, the source/drain pair passes through the barrier layer and extends into the channel layer, and the second fluorine holding layer is further disposed between the source/drain pair and the channel layer.

In some embodiments, the fluorine content of the first fluorine holding layer and the second fluorine holding layer is higher than the fluorine content outside the first fluorine holding layer and the second fluorine holding layer.

In some embodiments, the second fluorine holding layer has an opening with an area that is smaller than or equal to the area of the fluorinated region at the top of the compound semiconductor layer, and the gate is disposed at the opening.

In some embodiments, the first fluorine holding layer and the second fluorine holding layer each independently include aluminum nitride, aluminum gallium nitride, aluminum indium nitride, indium gallium nitride, or a combination thereof.

In some embodiments, the thickness of the first fluorine holding layer and the thickness of the second fluorine holding layer are each independently in a range of 0.5 nm to 5 nm.

In some embodiments, the semiconductor device further includes a two-dimensional electron gas recovery layer covering a sidewall of the compound semiconductor layer and extending between the source/drain pair and the barrier layer.

In accordance with another embodiment of the present disclosure, a method for forming a semiconductor device is provided. The method includes forming a channel layer over a substrate; forming a barrier layer over the channel layer; forming a compound semiconductor layer over the barrier layer; forming a source/drain pair over the substrate, wherein the source and the drain are on opposite sides of the compound semiconductor layer; introducing fluorine into the compound semiconductor layer; and forming a gate over the compound semiconductor layer.

In some embodiments, introducing the fluorine includes using etching equipment.

In some embodiments, introducing the fluorine includes using reactive ion etching, inductively coupled plasma etching, or a combination thereof.

In some embodiments, a distribution of the fluorine extends from the top of the compound semiconductor layer into the barrier layer.

In some embodiments, the method further includes performing the first heat treatment after introducing the fluorine and before forming the gate.

In some embodiments, the method further includes performing a second heat treatment after forming the gate.

In some embodiments, the method further includes introducing the fluorine into the barrier layer around the compound semiconductor layer.

In some embodiments, introducing the fluorine into the barrier layer around the compound semiconductor layer includes using heating equipment, etching equipment, or a combination thereof.

In some embodiments, the method further includes forming a first fluorine holding layer in situ during the formation of the compound semiconductor layer; and/or forming a second fluorine holding layer on a sidewall of the compound semiconductor layer after forming the compound semiconductor layer and before forming the gate, wherein the second fluorine holding layer extends between the source/drain pair and the channel layer.

In some embodiments, the method further includes the source/drain pair passing through the barrier layer and extending into the channel layer, and the second fluorine holding layer extending between the source/drain pair and the barrier layer.

In some embodiments, the method further includes forming an opening in the second fluorine holding layer over the compound semiconductor layer, and introducing the fluorine through the opening; and forming a gate at the opening.

In some embodiments, the method further includes forming a two-dimensional electron gas recovery layer on a sidewall of the compound semiconductor layer, wherein the two-dimensional electron gas recovery layer extending between the source/drain pair and the channel layer.

BRIEF DESCRIPTION OF THE DRAWINGS

The disclosure can be more fully understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations.

A semiconductor device and a method for forming the same are described in accordance with some embodiments of the present disclosure, and are particularly applicable to a high electron mobility transistor (HEMT). The present disclosure introduces fluorine into a compound semiconductor layer of a semiconductor device to form a fluorinated region to raise the surface potential and change the energy band, thereby improving the threshold voltage (Vth) and gate swing.

Figure 1A:
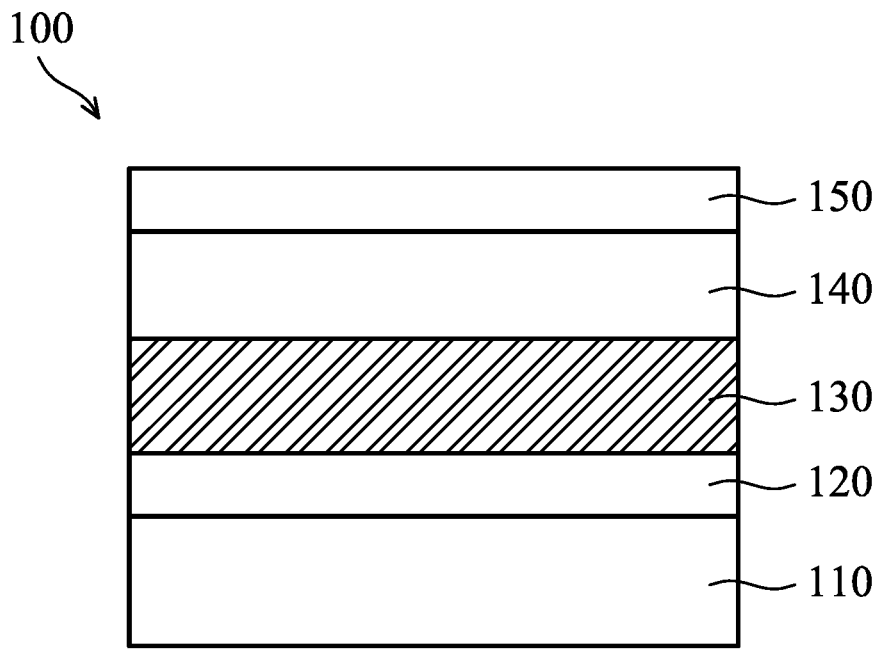
FIGS. 1A-1F are cross-sectional views illustrating a semiconductor device at various stages of manufacture in accordance with some embodiments.

FIGS. 1A-1F are cross-sectional views illustrating a semiconductor device 100 at various stages of manufacture in accordance with some embodiments. As shown in FIG. 1A, a semiconductor device 100 includes a substrate 110. Any substrate material suitable for a semiconductor device may be used. The substrate 110 may be a bulk semiconductor substrate or a composite substrate formed of different materials, and the substrate 110 may be doped (e.g., using p-type or n-type dopants) or undoped. In some embodiments, the substrate 110 may include a semiconductor substrate, a glass substrate, or a ceramic substrate, for example, a silicon substrate, a silicon germanium substrate, a silicon carbide (SiC) substrate, an aluminum nitride (AlN) substrate, a sapphire substrate, a combination thereof, or the like. In some embodiments, the substrate 110 may include a semiconductor-on-insulator (SOI) substrate formed by providing a semiconductor material over an insulating layer.

In some embodiments, a nucleation layer 120 is formed over the substrate 110 to relieve the lattice mismatch between the substrate 110 and layers grown thereon and improve the crystalline quality. The nucleation layer 120 may be formed by a deposition process, such as metal organic chemical vapor deposition (MOCVD), atomic layer deposition (ALD), molecular beam epitaxy (MBE), liquid phase epitaxy (LPE), the like, or a combination thereof. In some embodiments, the thickness of the nucleation layer 120 may range from about 1 nanometer (nm) to about 500 nm, such as about 200 nm.

In some embodiments, a buffer layer 130 is formed over the nucleation layer 120 to relieve the lattice mismatch between different layers and to improve the crystalline quality. The nucleation layer 120 is optional. In other embodiments, the buffer layer 130 may be formed directly on the substrate without providing the nucleation layer 120, to reduce the number of steps in the process and to improve the performance. In some embodiments, the buffer layer 130 may include a group III-V compound semiconductor material, such as a group III nitride. For example, the buffer layer 130 may include gallium nitride (GaN), aluminum nitride (AlN), aluminum gallium nitride (AlGaN), aluminum indium nitride (AlInN), indium gallium nitride (InGaN), the like, or a combination thereof. In some embodiments, the buffer layer 130 may be formed by a deposition process, such as MOCVD, ALD, MBE, LPE, the like, or a combination thereof.

Then, a channel layer 140 is formed over the buffer layer 130. In some embodiments, the channel layer 140 may include one or more group III-V compound semiconductor materials, such as a group III nitride. In some embodiments, the channel layer 140 is, for example, GaN, AlGaN, InGaN, InAlGaN, the like, or a combination thereof. In addition, the channel layer 140 may be doped or undoped. In accordance with some embodiments, the channel layer 140 may be formed by a deposition process, such as MOCVD, ALD, MBE, LPE, the like, or a combination thereof. In some embodiments, the thickness of the channel layer 140 may range from about 0.05 micrometers (µm) to about 1 µm, such as about 0.2 µm.

Then, a barrier layer 150 is formed over the channel layer 140 to create a two-dimensional electron gas (2DEG) at an interface between the channel layer 140 and the barrier layer 150. The barrier layer 150 may be formed by a deposition process, such as MOCVD, ALD, MBE, LPE, the like, or a combination thereof. In some embodiments, the barrier layer 150 may include a group III-V compound semiconductor material, such as a group III nitride. For example, the barrier layer 150 may include AlN, AlGaN, AlInN, AlGaInN, the like, or a combination thereof. The barrier layer 150 may include a single layer or a multilayer structure, and the barrier layer 150 may be doped or undoped. In some embodiments, the thickness of the barrier layer 150 may range from about 1 nm to about 30 nm, such as about 20 nm.

Figure 1B:
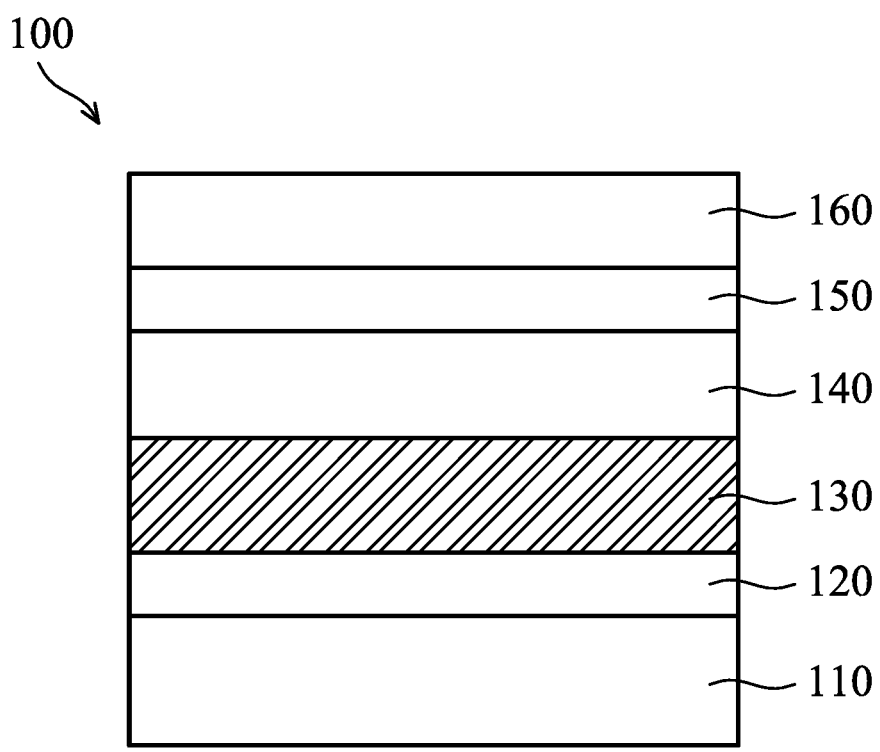

Next, as shown in FIG. 1B, a compound semiconductor layer 160 is disposed over the barrier layer 150 to vacate the 2DEG under a gate to achieve a normally-off state of the semiconductor device in accordance with some embodiments. In some embodiments, the compound semiconductor layer 160 includes u-type, n-type or p-type doped GaN. In some embodiments, the compound semiconductor layer 160 may be formed by a deposition process, such as MOCVD, ALD, MBE, LPE, the like, or a combination thereof. In some embodiments, the thickness of the compound semiconductor layer 160 may range from about 30 nm to about 150 nm, such as about 80 nm.

Figure 1C:
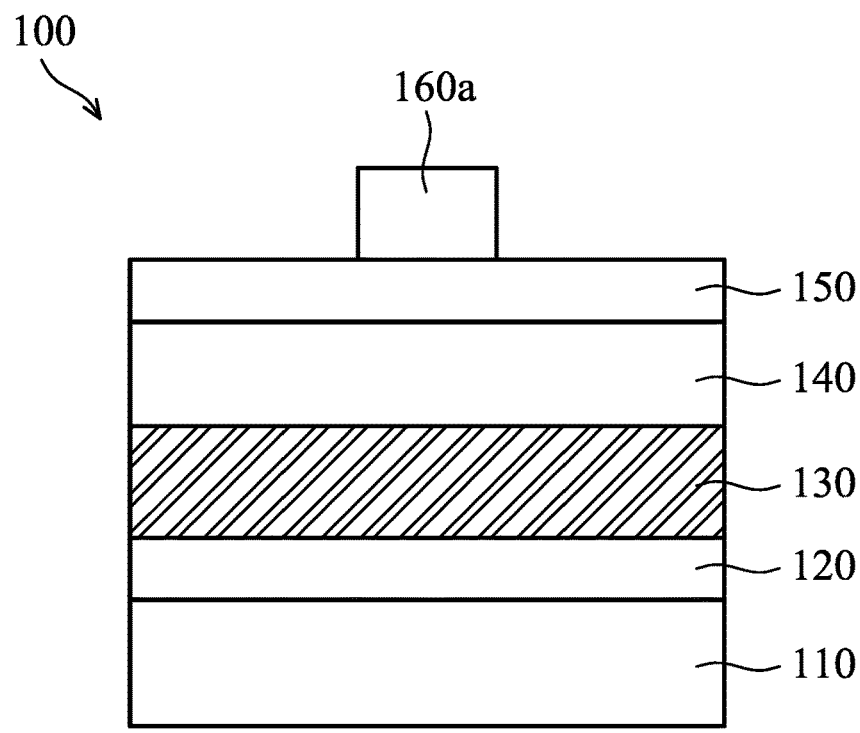

Next, as shown in FIG. 1C, in accordance with some embodiments, a patterned mask layer (not illustrated) is formed on the compound semiconductor layer 160, then the compound semiconductor layer 160 is etched to remove a portion of the compound semiconductor layer 160 that is not covered by the patterned mask layer, and the compound semiconductor layer 160a is formed. The position of the compound semiconductor layer 160a is adjusted according to the position of the gate to be set.

In some embodiments, the patterned mask layer may be a photoresist, such as a positive photoresist or a negative photoresist. In other embodiments, the patterned mask layer may be a hard mask, such as silicon oxide, silicon nitride, silicon oxynitride, silicon carbide, silicon carbonitride, the like, or a combination thereof. In some embodiments, the patterned mask layer may be formed by spin-on coating, physical vapor deposition (PVD), chemical vapor deposition (CVD), the like, or a combination thereof.

In some embodiments, the compound semiconductor layer 160 may be etched by using a dry etching process, a wet etching process, or a combination thereof. For example, the compound semiconductor layer 160 may be etched by reactive ion etching (RIE), inductively-coupled plasma (ICP) etching, neutral beam etching (NBE), electron cyclotron resonance (ERC) etching, the like, or a combination thereof. Furthermore, the compound semiconductor layer 160a as illustrated in the figures has substantially vertical sidewalls and a flat upper surface, but the present disclosure is not limited thereto, and the compound semiconductor layer 160a may have another shape, such as an inclined sidewall and/or an uneven surface.

Figure 1D:
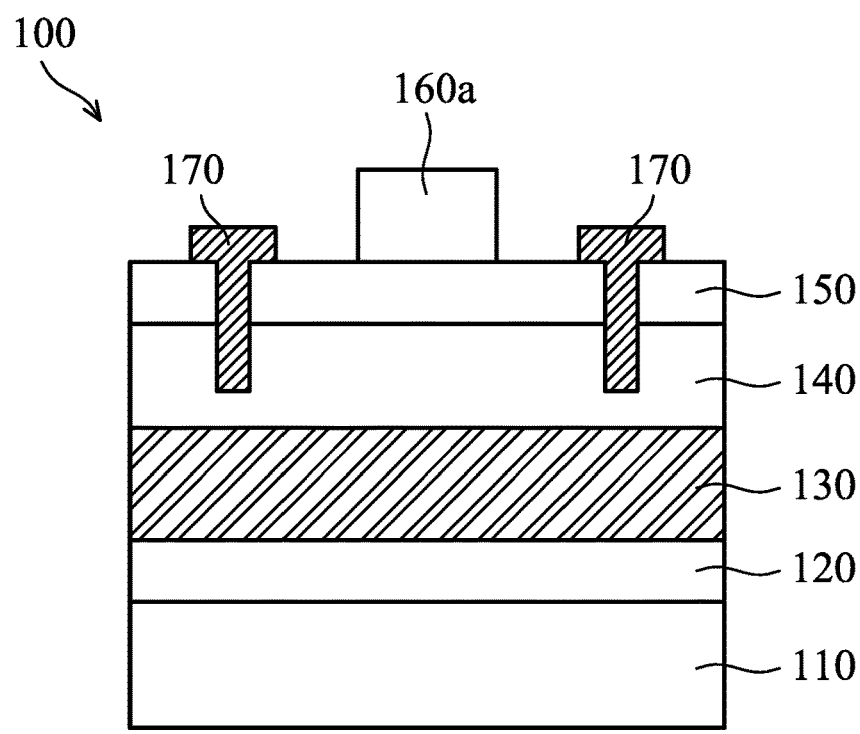

Next, as shown in FIG. 1D, a source/drain pair 170 is disposed over the substrate 110 and the source and the drain of the source/drain pair 170 are respectively located on opposite sides of the compound semiconductor layer 160a, in accordance with some embodiments. In some embodiments, the source/drain pair 170 may be formed by a patterning process that recesses the barrier layer 150 and the channel layer 140 on opposite sides of the compound semiconductor layer 160a and forms a pair of recesses that pass through the barrier layer 150 and extend into the channel layer 140. Then a conductive material is deposited in the pair of recesses, and a patterned process is performed on the deposited conductive material to form the source/drain pair 170.

In some embodiments, the deposition process of the conductive material may include PVD, CVD, ALD, MBE, LPE, the like, or a combination thereof. In some embodiments, the conductive material may include a metal, a metal silicide, a semiconductor material, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), titanium nitride (TiN), the like, an alloy thereof, a multilayer thereof, or a combination thereof, and the semiconductor material may include polycrystalline silicon (poly-Si) or polycrystalline germanium (poly-Ge). Moreover, the shape of the source/drain pair 170 is not limited to vertical sidewalls as illustrated in the figures, may also have tapered sidewalls or have another shape.

In the embodiment as illustrated in FIG. 1D, the source/drain pair 170 is located on the barrier layer 150 and extends into the barrier layer 150 and the channel layer 140, but the present disclosure is not limited thereto. The depth to which the source/drain pair 170 extends may be adjusted based on the selected process and equipment. For example, the source/drain pair 170 may extend only into a portion of the barrier layer 150 or not extend into the barrier layer 150 to avoid the source/drain pair 170 passing through the 2DEG, and thereby maintaining the 2DEG at the interface between the channel layer 140 and the barrier layer 150.

Figure 1E:
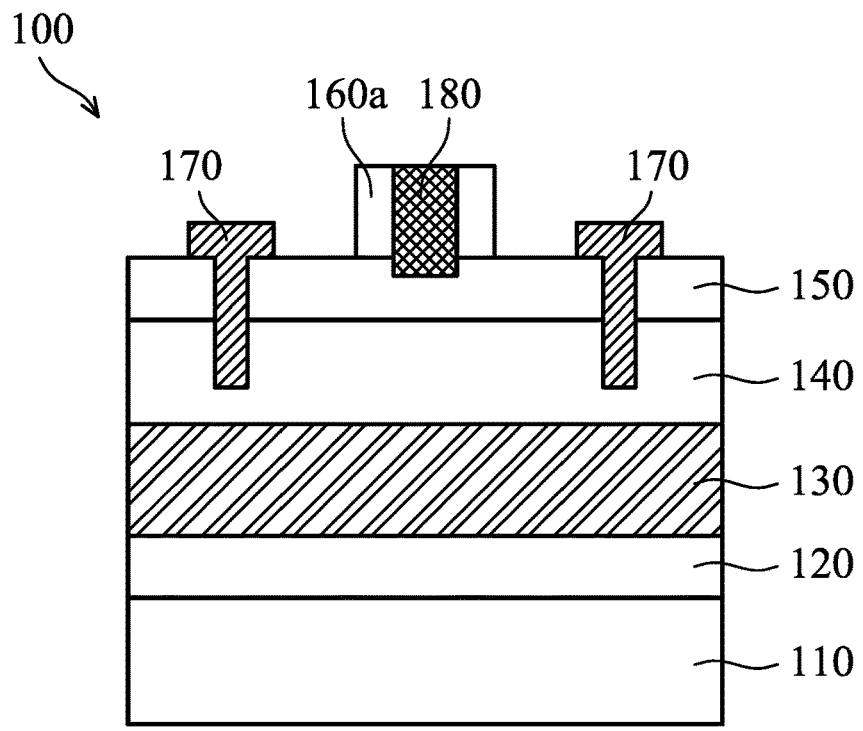

Then, as shown in FIG. 1E, fluorine is introduced into the compound semiconductor layer 160a to form a fluorinated region 180. The present disclosure introduces the fluorine into the compound semiconductor layer 160a to form the fluorinated region 180, which can raise the surface potential and change the energy band. Raising the surface potential can increase the work function of a gate metal contact, and thereby improve the threshold voltage (Vth) and the gate swing. Furthermore, for the compound semiconductor layer 160a being doped n-type or p-type gallium nitride, since the introduced fluorine does not affect the conductivity type, a p-n junction is not formed in the compound semiconductor layer 160a, which is advantageous for the switching performance of the semiconductor device 100. In addition, the bonding of fluoride ions in gallium nitride can pull up the energy band distribution, which has an effect of depleting the 2DEG, and can achieve an effect of increasing the threshold voltage.

In some embodiments, the fluorinated region 180 may be formed by using a mask (not shown) which exposes a portion of the compound semiconductor layer 160a, and then introducing the fluorine into the exposed portion of the compound semiconductor layer 160a. The shape of the mask will determine the distribution of the fluorinated region 180. In some embodiments, the mask may substantially cover a region outside the compound semiconductor layer 160a to form the fluorine with a uniform concentration in the compound semiconductor layer 160a. In another embodiment, the mask may be mesh shape to divide the introduction of the fluorine into separate portions with higher concentration in the compound semiconductor layer 160a, and to prevent the fluorinated region 180 from being too high.

In some embodiments, the fluorine may be introduced by using etching equipment. In some embodiments, the etching equipment may include, for example, reactive ion etching (RIE), inductively coupled plasma etching (ICP), the like, or a combination thereof. The fluorine source may be tetrafluoromethane ($CF_4$), trifluoromethane ($CHF_3$), sulfur hexafluoride ($SF_6$), the like, or a combination thereof. In some embodiments, an amount of the fluorine introduced may range from about $1 \times 10^{12}$ atoms/cm$^2$ to about $5 \times 10^{15}$ atoms/cm$^2$, for example, range from about $5 \times 10^{14}$ atoms/cm$^2$ to $1 \times 10^{15}$ atoms/cm$^2$, which can improve the threshold voltage and minimize effects that surrounding components may be suffered.

In the embodiments that introducing the fluorine by using etching equipment, since the etching equipment can achieve a relatively low ion acceleration voltage with respect to ion implantation, bombardment damage to the element can be reduced while a relatively stable ion concentration and distribution can be achieved.

The fluorinated region 180 is then optionally heat treated, such as by a rapid thermal process (RTP), to control the distribution of the fluorine. The heat treatment in this step can repair the surface of the element bombarded by fluoride ions while making the fluoride ions redistribute to a stable value within the element, and thereby improving the operational performance and reliability of the element. In some embodiments, the temperature of the heat treatment may range from about 300° C. to about 500° C., and the duration may range from about 5 minutes to about 15 minutes.

Although in the illustrated example, the fluorinated region 180 extends from the top of the compound semiconductor layer 160a into the barrier layer 150, the present disclosure is not limited thereto. In some embodiments, the fluorinated region 180 may extend from the top of the compound semiconductor layer 160a further into the channel layer 140, such as by adjusting parameters of the heat treatment or increasing the power of introducing the fluorine. In another embodiment, the fluorinated region 180 may be located only within the compound semiconductor layer 160a without extending into the barrier layer 150 to adjust the threshold voltage (Vth).

Figure 1F:
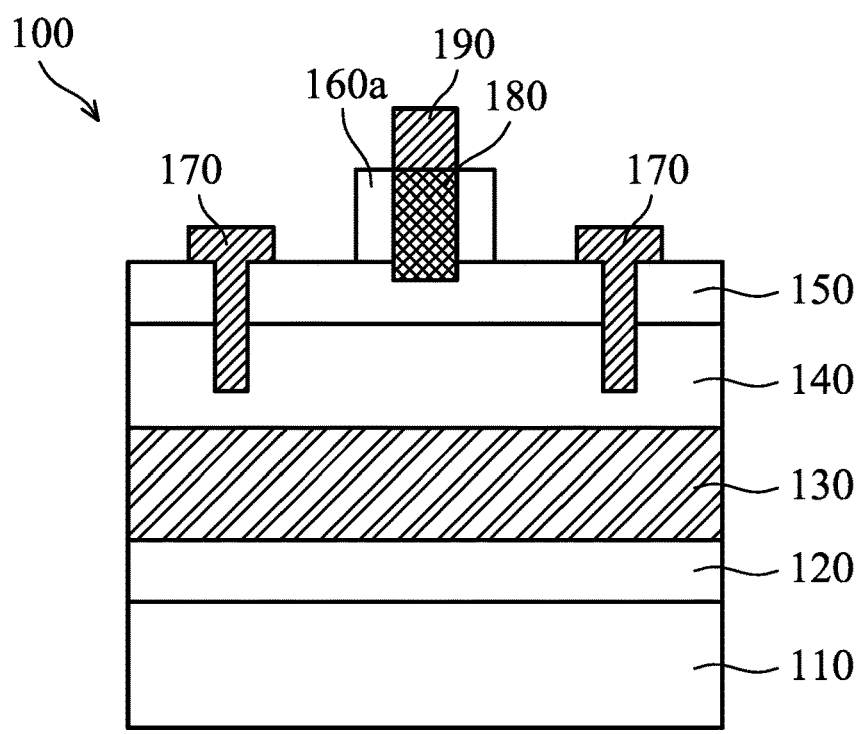

Next, as shown in FIG. 1F, a gate 190 is disposed over the compound semiconductor layer 160a to form the semiconductor device 100. In some embodiments, the gate 190 may be formed by depositing a conductive material over the compound semiconductor layer 160a, and then a patterning process may be performed on the deposited conductive material to form the gate 190.

In some embodiments, the deposition process and the material of the conductive material may include the deposition process and the materials as described above with respect to the conductive material of forming the source/drain pair 170, and will not be repeated again. The source/drain pair 170 and the gate 190 may each independently include the same or different processes and materials. In addition, although it is described herein that the gate 190 is formed after the formation of the source/drain pair 170, the present disclosure is not limited thereto. For example, the source/drain pair 170 and the gate 190 may be formed in the same step.

Moreover, the shape of the gate 190 is not limited to vertical sidewalls as illustrated in the figures, but the gate 190 may have inclined sidewalls or have another shape. Although in the embodiment illustrated in FIG. 1F, a bottom surface of the gate 190 has substantially the same area as a top surface of the fluorinated region 180, the present disclosure is not limited thereto. The bottom surface of the gate 190 may be larger or smaller than the top surface of the fluorinated region 180.

Then a heat treatment, such as rapid thermal process (RTP), may be performed to adjust the distribution of the fluorinated region 180 and to improve the contact characteristics of the gate metal. In some embodiments, the temperature of the heat treatment may range from about 300° C. to about 400° C., and the duration may range from about 5 minutes to about 10 minutes.

Although it is described herein that the heat treatment is performed twice, one or more heat treatments may be performed depending on the predetermined distribution of the fluorinated region 180 and the stability-controlled ability of the fluorine ion implantation. In some embodiments, only the heat treatment after the formation of the gate may be performed, and the heat treatment before the formation of the gate is not performed to reduce the steps in the process. In another embodiment, heat treatments may be performed both before and after the formation of the gate to better control the distribution of the fluorinated region 180.

Figure 2:
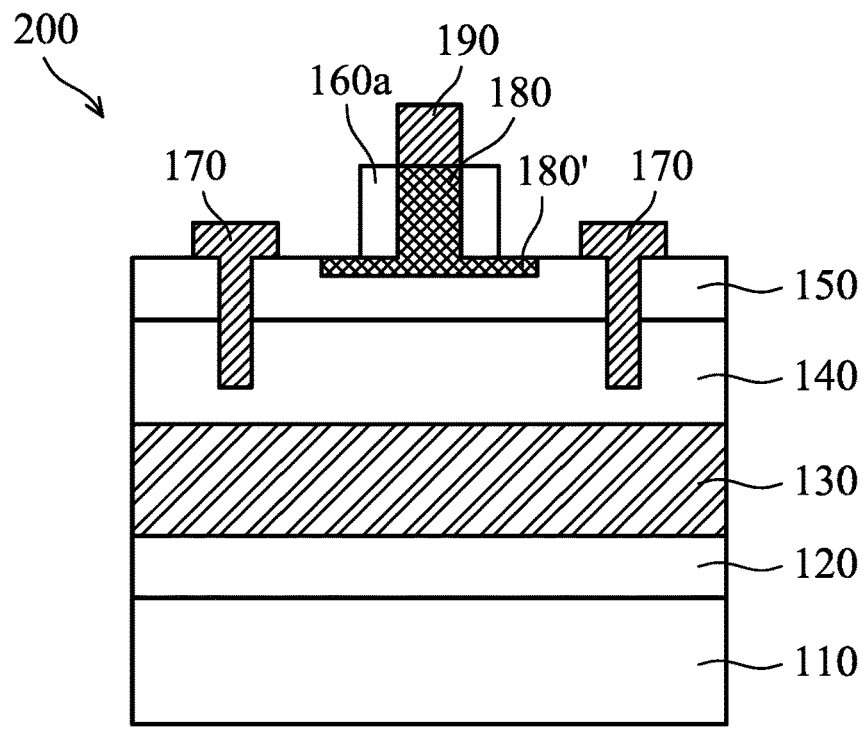
FIG. 2 is a cross-sectional view illustrating a semiconductor device in accordance with another embodiment.

FIG. 2 is a cross-sectional view illustrating a semiconductor device 200 in accordance with some embodiments. In some embodiments, as shown in FIG. 2, the fluorinated region 180 may be distributed further in the barrier layer 150 around the compound semiconductor layer 160a to form a fluorinated region 180' to suppress leakage.

In some embodiments, the fluorinated region 180' may be formed by the methods and the fluorine source for forming the fluorinated region 180 as described above after the formation of the fluorinated region 180, to introduce the fluorine into the barrier layer 150 surrounding the compound semiconductor layer 160a. Alternatively, in another embodiment, a mask exposing the compound semiconductor layer 160a and the barrier layer 150 that surrounds it may be used to form the fluorinated region 180' in one step. Alternatively, in another embodiment, one or more heat treatments as described above may be controlled to diffuse the fluorine from the fluorinated region 180 into the barrier layer 150 to form the fluorinated region 180' without additional introduction of fluorine to reduce the number of steps in the process, reduce the cost, and increase productivity.

In the semiconductor device 200 illustrated in FIG. 2, the fluorinated region 180' is provided in the barrier layer 150 around the compound semiconductor layer 160a, which can suppress leakage and improve the yield of the semiconductor device 200.

Figure 3:
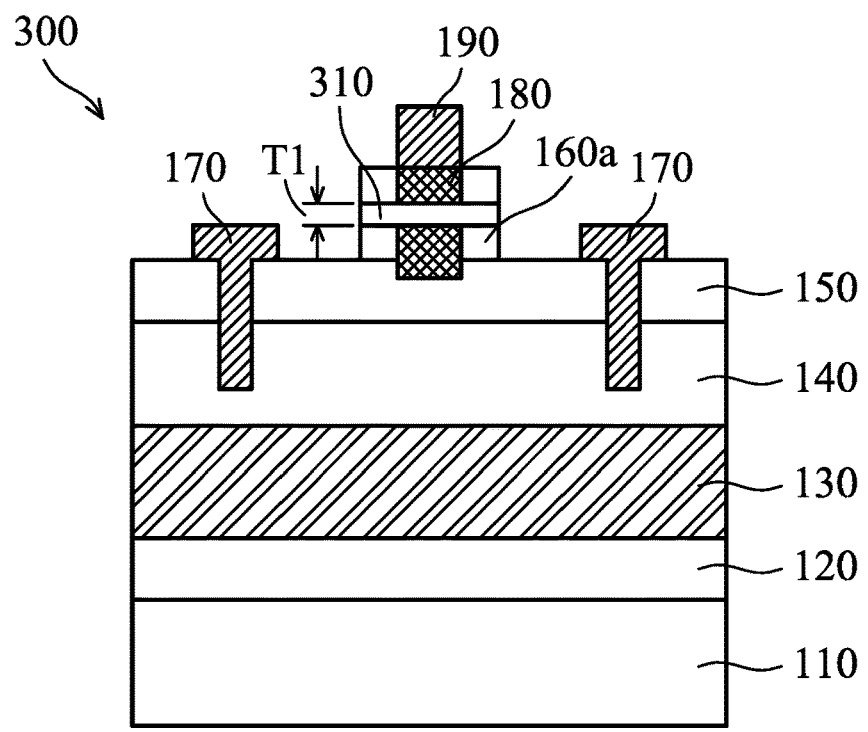
FIG. 3 is a cross-sectional view illustrating a semiconductor device in accordance with another embodiment.

FIG. 3 is a cross-sectional view illustrating a semiconductor device 300 in accordance with some embodiments. In some embodiments, as shown in FIG. 3, a first fluorine holding layer 310 may be disposed in the compound semiconductor layer 160a to form a stable compound with the fluorine in the fluorinated region 180 to avoid the fluorine diffusing outward and affecting other elements. The material of the first fluorine holding layer 310 may include aluminum nitride (AlN), aluminum gallium nitride (AlGaN), aluminum indium nitride (AlInN), indium gallium nitride (InGaN), the like, or a combination thereof, which may form aluminum fluoride (AlF) with the introduced fluorine. Since AlF is stable under the heat treatment in the subsequent process, the thermal stability of the fluorinated region 180 can be increased. Therefore, the fluorine content in the first fluorine holding layer 310 is higher than the fluorine content outside the first fluorine holding layer 310.

In some embodiments, the formation of the first fluorine holding layer 310 may include a deposition process such as MOCVD, ALD, MBE, LPE, the like, or a combination thereof. The first fluorine holding layer 310 may be formed in situ during the formation of the compound semiconductor layer 160a. Although the first fluorine holding layer 310 is located in the compound semiconductor layer 160a in the illustrated embodiment, the present disclosure is not limited thereto. In some embodiments, the first fluorine holding layer 310 may be disposed on the top or the bottom of the compound semiconductor layer 160a. In some embodiments, the thickness T1 of the first fluorine holding layer 310 may range from about 0.5 nm to about 5 nm, such as about 4 nm.

In accordance with some embodiments of the present disclosure, the first fluorine holding layer 310 is disposed in the compound semiconductor layer 160a to improving the thermal stability of the fluorine and avoiding the fluorine diffusing outward, and further protecting the underlying region and thereby avoiding affected by subsequent processes, and enhancing the yield of the semiconductor device 300.

Figure 4A:
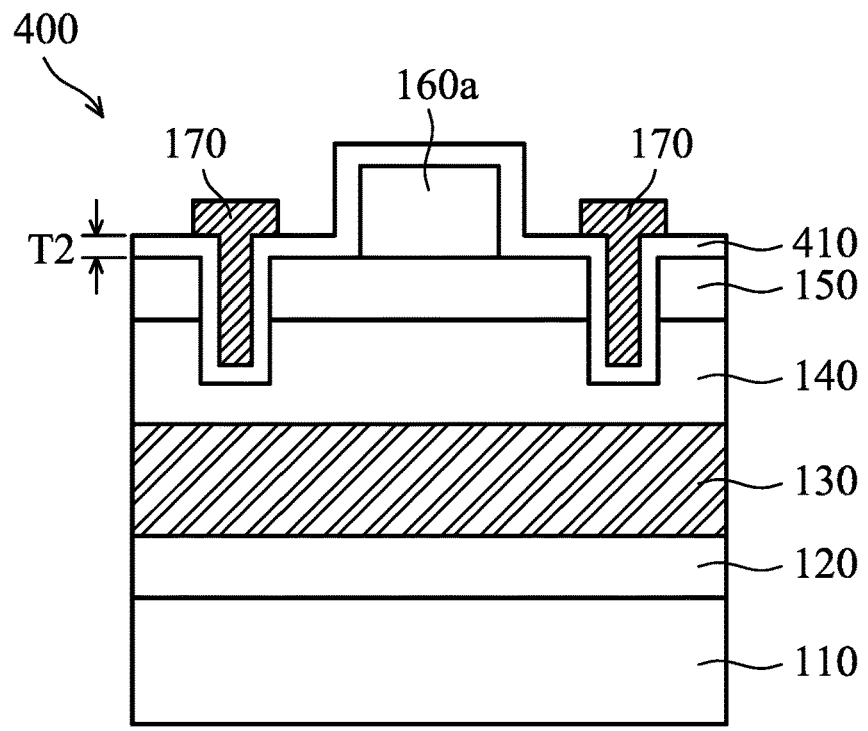
FIGS. 4A-4D are cross-sectional views illustrating a semiconductor device at various stages of manufacture in accordance with another embodiment.

FIGS. 4A-4D are cross-sectional views illustrating a semiconductor device 400 at various stages of manufacture in accordance with some embodiments. FIG. 4A is a continuation of the description of FIG. 1C, the same elements are described by the same reference numerals, and the forming method and the materials of these elements are as described above, and will not be repeated again.

In some embodiments, as shown in FIG. 4A, a second fluorine holding layer 410 may be disposed to cover a sidewall of the compound semiconductor layer 160a and extend between the source/drain pair 170 and the barrier layer 150 to avoid the fluorine diffusing outward and to protect elements underneath. In some embodiments, the second fluorine holding layer 410 may be formed by choosing the processes and the materials of the first fluorine holding layer 310 as described above. In some embodiments, a thickness T2 of the second fluorine holding layer 410 may range from about 0.5 nm to about 5 nm, such as about 4 nm.

As described above, the depth at which the source/drain pair 170 extends to the film layer may be adjusted, and thus the position of the second fluorine holding layer 410 may also be adjusted. For example, in some embodiments, for the case where the source/drain pair 170 extend only into a portion of the barrier layer 150 or not extend into the barrier layer 150, the second fluorine holding layer 410 extends between the source/drain pair 170 and the barrier layer 150. On the other hand, for the case where the source/drain pair 170 further extend into the channel layer 140, the second fluorine holding layer 410 is further disposed between the source/drain pair 170 and the channel layer 140.

Figure 4B:
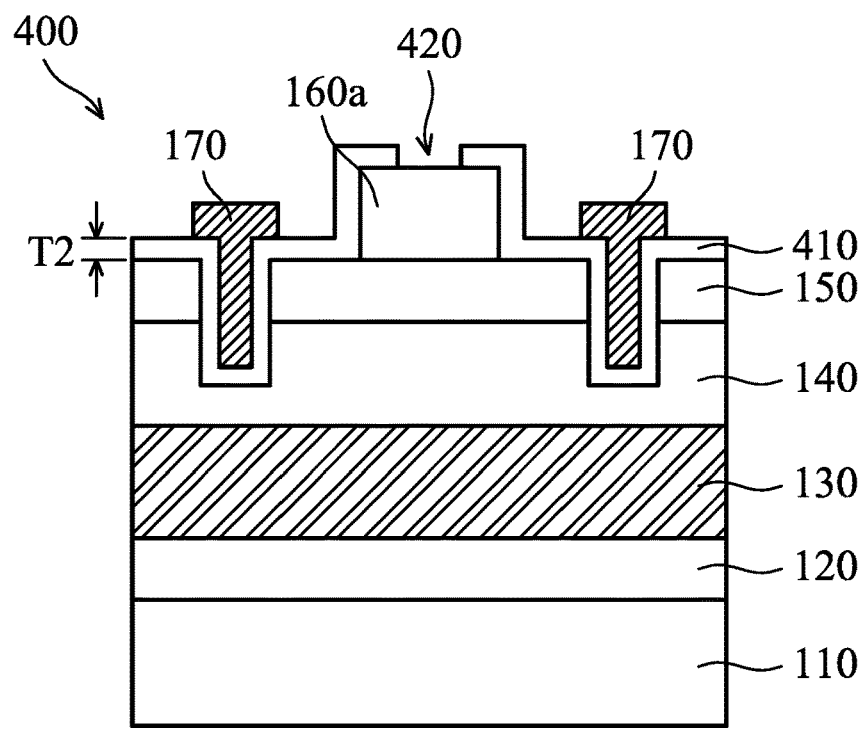

Next, as shown in FIG. 4B, an opening 420 is formed in the second fluorine holding layer 410, and the opening 420 is located above the compound semiconductor layer 160a. The position of the opening 420 is adjusted in accordance with the predetermined position of the gate. In some embodiments, the opening 420 may be formed by using a patterned mask layer (not shown) and etching a portion of the second fluorine holding layer 410 that is exposed by the patterned mask layer to remove the portion of the second fluorine holding layer 410. The materials and the forming methods for the patterned mask layer are as described above, and will not be repeated again.

In some embodiments, the second fluorine holding layer 410 may be etched by using a dry etching process, a wet etching process, or a combination thereof. For example, the second fluorine holding layer 410 may be etched by reactive ion etching (RIE), inductively coupled plasma (ICP) etching, neutron beam etching (NBE), electron cyclotron resonance (ERC) etching, the like, or a combination thereof.

Figure 4C:
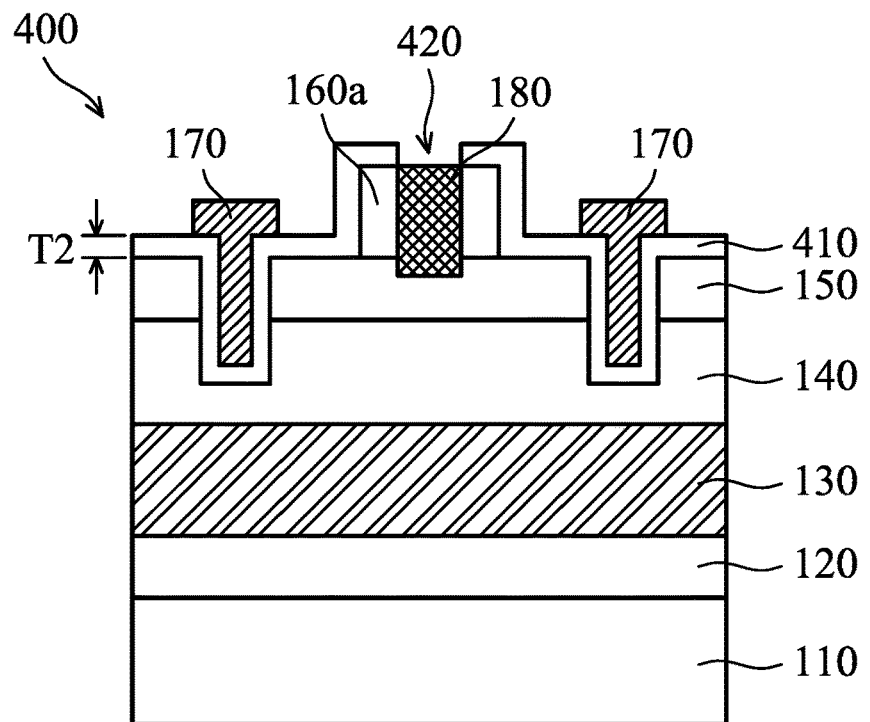

Next, as shown in FIG. 4C, the fluorine is introduced through the opening 420 to form a fluorinated region 180. The fluorinated region 180 may be formed by using the processes and the materials as described above, and a heat treatment may be optionally performed after the fluorinated region 180 is formed, or may be formed as the fluorinated region 180' extending into the barrier layer 150 around the compound semiconductor layer 160a as illustrated in FIG. 2. Furthermore, since the fluorine is introduced via the opening 420, the area of the opening 420 is substantially smaller than or equal to the area of the fluorinated region 180/180' at the top of the compound semiconductor layer 160a. Furthermore, the fluorine may be introduced by using the same patterned mask layer as the opening 420 to reduce the steps in the process.

Figure 4D:
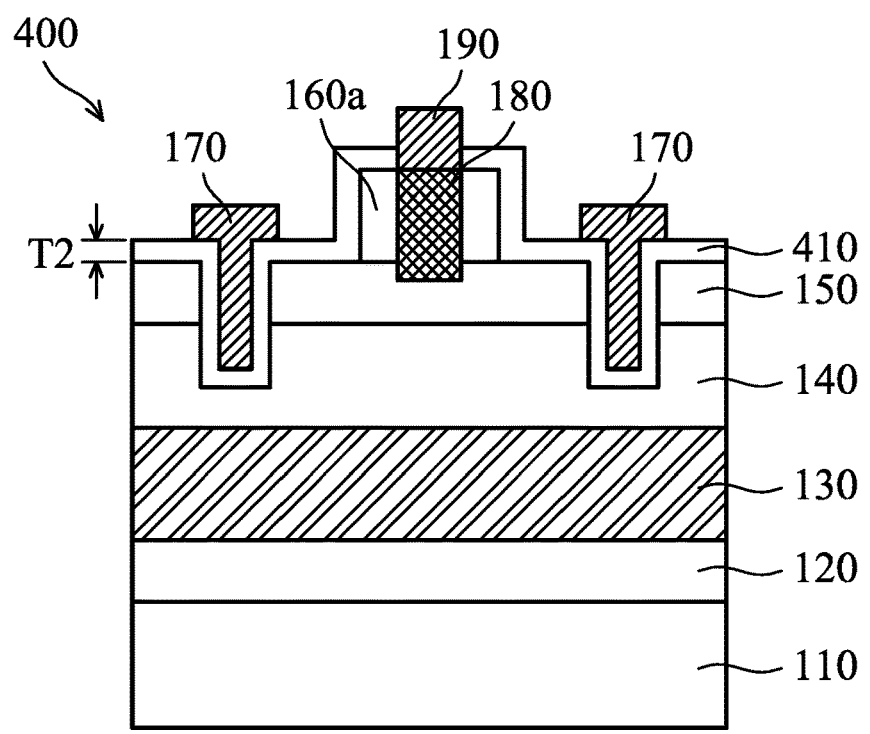

Next, as shown in FIG. 4D, the gate 190 is disposed in the opening 420 above the compound semiconductor layer 160a to form the semiconductor device 400. The material and the process for forming the gate 190 are as described above, and will not be repeated again. The gate 190 may be formed by using the same patterned mask layer as the opening 420 to reduce the steps in the process. In addition, although it is described herein that the gate 190 is formed after the formation of the source/drain pair 170, the present disclosure is not limited thereto. For example, the source/drain pair 170 and the gate 190 may be formed at the same time.

Although in the embodiment illustrated in FIG. 4D, the bottom surfaces of the gate 190 and the opening 420 have substantially the same area as the top surface of the fluorinated region 180, the present disclosure is not limited thereto. In addition, the gate 190 is not limited to vertical sidewalls as illustrated in the figures, and the gate 190 may have an inclined sidewall or a stepped sidewall covering a portion of the second fluorine holding layer 410.

Next, another heat treatment, such as a rapid thermal process, may be performed on the semiconductor device 400 to adjust the distribution of the fluorinated region 180. The temperature, the duration and the number of the heat treatments are as described above, and will not be repeated again.

In accordance with some embodiments of the present disclosure, the semiconductor device 400 has a second fluorine holding layer 410 covering a sidewall of the compound semiconductor layer 160a and extending between the source/drain pair 170 and the barrier layer 150 to form a stable compound with the fluorine to enhance the thermal stability of the fluorinated region 180 to avoid the fluorine diffusing outward, and further to protect the underlying region during subsequent processes to improve the yield of the semiconductor device 400.

Figure 5:
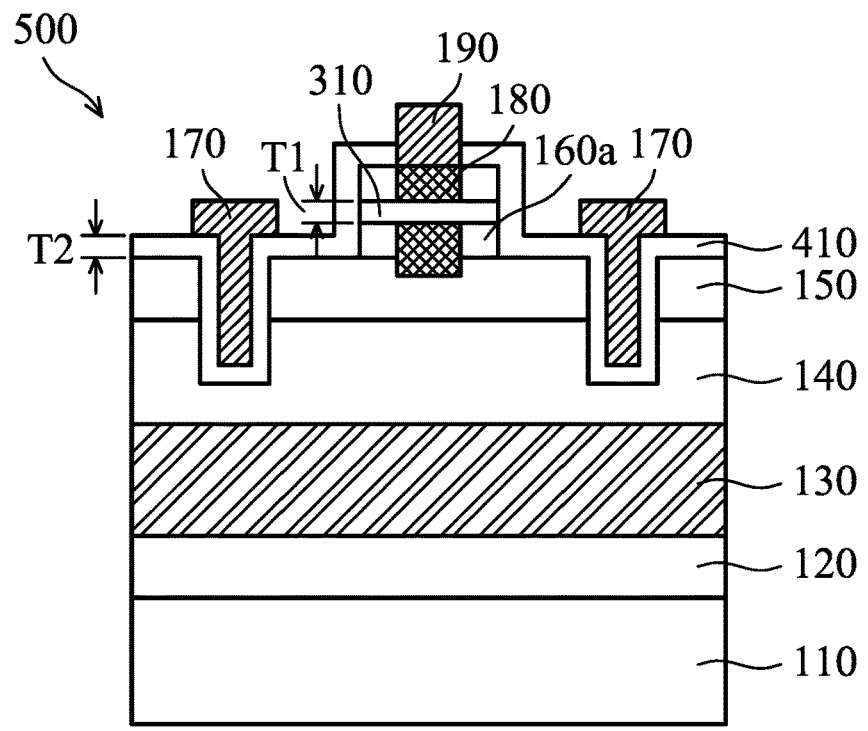
FIG. 5 is a cross-sectional view illustrating a semiconductor device in accordance with another embodiment.

FIG. 5 is a cross-sectional view illustrating a semiconductor device 500 in accordance with some embodiments. In some embodiments, as shown in FIG. 5, the first fluorine holding layer 310 and the second fluorine holding layer 410 may be both disposed to further enhance the thermal stability of the fluorine holding layer 180 and to more protect the region underneath the first fluorine holding layer 310 and the second fluorine holding layer 410 to enhance the yield of the semiconductor device 500. The positions, the materials, and the processes of the first fluorine holding layer 310 and the second fluorine holding layer 410 are as described above, and will not be repeated again.

For convenience of illustration, the thickness T1 of the first fluorine holding layer 310 is substantially equal to the thickness T2 of the second fluorine holding layer 410, but the present disclosure is not limited thereto. The thickness T1 may be larger than, equal to, or smaller than the thickness T2. In addition, the first fluorine holding layer 310 and the second fluorine holding layer 410 may be formed by the same or different processes and materials, and the positions of the first fluorine holding layer 310 and the second fluorine holding layer 410 may also be adjusted.

Figure 6:
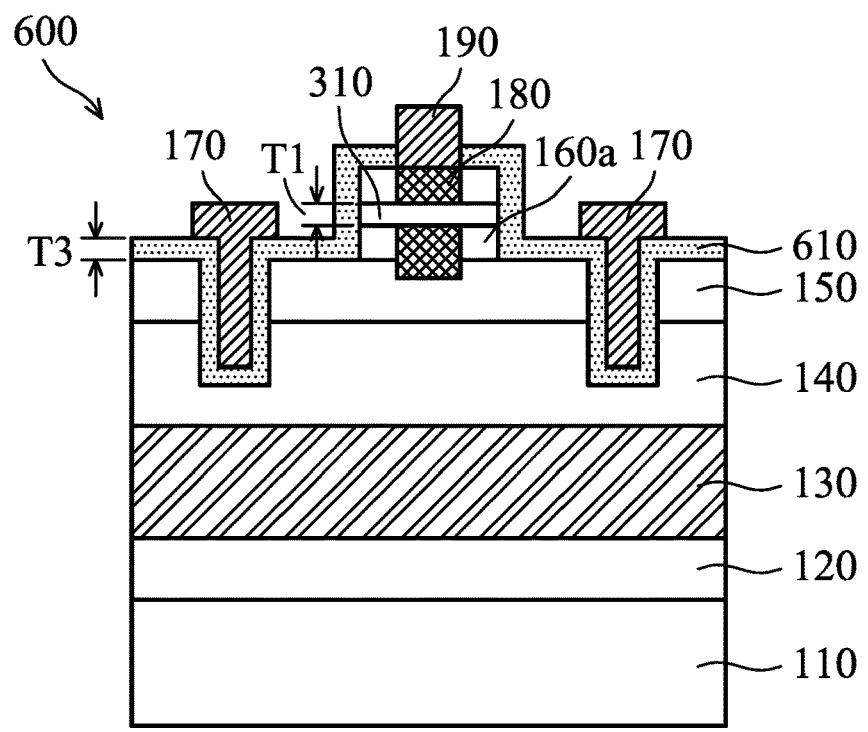
FIG. 6 is a cross-sectional view illustrating a semiconductor device in accordance with another embodiment.

FIG. 6 is a cross-sectional view illustrating a semiconductor device 600 in accordance with some embodiments. In some embodiments, as shown in FIG. 6, the semiconductor device 600 further includes a two-dimensional electron gas recovery layer 610 covering the sidewall of the compound semiconductor layer 160a and extending between the source/drain pair 170 and the barrier layer 150 to recover the channel of the 2DEG around the source/drain pair 170.

In some embodiments, the two-dimensional electron gas recovery layer 610 may be formed by a deposition process, such as MOCVD, ALD, MBE, LPE, the like, or a combination thereof. The material of the two-dimensional electron gas recovery layer 610 may include a binary compound semiconductor of a hexagonal crystal, graphene, the like, or a combination thereof. In some embodiments, the material of the two-dimensional electron gas recovery layer 610 includes aluminum nitride (AlN), zinc oxide (ZnO), indium nitride (InN), the like, or a combination thereof.

As described above, the depth at which the source/drain pair 170 extends into the layer may be adjusted, and thus the position of the two-dimensional electron gas recovery layer 610 may also be adjusted as needed. Furthermore, the two-dimensional electron gas recovery layer 610 may have an opening in which the gate 190 is disposed, and the fluorine is introduced through the opening, and thus the area of the opening is substantially smaller than or equal to the area of the fluorinated region 180 at the top of the compound semiconductor layer 160*a*. The method of forming the opening and the process of introducing the fluorine are described above, and will not be repeated again.

Furthermore, although the semiconductor device 600 has the first fluorine holding layer 310 and the two-dimensional electron gas recovery layer 610 as illustrated in FIG. 6, the present disclosure is not limited thereto, for example, only the two-dimensional electron gas recovery layer 610 may be provided.

In some embodiments, a thickness T3 of the two-dimensional electron gas recovery layer 610 may range from about 0.5 nm to about 5 nm, such as about 4 nm. For convenience of illustration, the thickness T1 of the first fluorine holding layer 310 is substantially equal to the thickness T3 of the two-dimensional electron gas recovery layer 610, but the present disclosure is not limited thereto. The thickness T1 may be larger than, equal to, or smaller than the thickness T3. Furthermore, the positions of the first fluorine holding layer 310 and the two-dimensional electron gas recovery layer 610 are not limited to the illustrated figures, and for example, the first fluorine holding layer 310 may be disposed at the bottom of the compound semiconductor layer 160*a*.

In accordance with some embodiments of the present disclosure, a two-dimensional electron gas recovery layer 610 is disposed on the semiconductor device 600 to lower the junction resistance ($R_C$) and improve the on-resistance ($R_{ON}$), and further to protect the underlying layers from the impact of subsequent processes to enhance the performance and yield of the semiconductor device 600.

According to some embodiments, the present disclosure introduces fluorine into a compound semiconductor layer of a semiconductor device to form a fluorinated region in the compound semiconductor layer, which can raise the surface potential and change the energy band, and thereby improving the threshold voltage and the gate swing of the semiconductor device. Since the introduced fluorine does not form a p-n junction with the compound semiconductor layer, which is advantageous for the switching performance of the semiconductor device. Furthermore, it is also possible to suppress leakage by adjusting the distribution and content of fluorine, for example, by introducing fluorine into the barrier layer around the compound semiconductor layer. In addition, using etching equipment to introduce fluorine can reduce the bombardment damage to the elements and achieve stable ion concentration and distribution.

According to another embodiments, the present disclosure provides a fluorine holding layer on a top, an interior, a bottom, and/or a sidewall of the compound semiconductor layer, which can avoid the fluorine in the fluorinated region diffusing outward, and can avoid the subsequent process affecting the region within the fluorine holding layer and can improve the yield of semiconductor devices. In addition, according to another embodiments, the two-dimensional electron gas recovery layer covers a sidewall of the compound semiconductor layer and extends between the source/drain pair and the barrier layer to recover the channel of the 2DEG around the source/drain pair to reduce the junction resistance ($R_C$) and improve the on-resistance ($R_{ON}$), and further to protect the area underneath.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced without does not depart from the spirit and scope of the disclosure. Therefore, the scope of protection of the present disclosure is defined as the subject matter set forth in the appended claims.

What is claimed is:

1. A method for forming semiconductor devices, comprising:
    forming a channel layer over a substrate;
    forming a barrier layer over the channel layer;
    forming a compound semiconductor layer over the barrier layer;
    forming a source/drain pair over the substrate, wherein the source and the drain are on opposite sides of the compound semiconductor layer;
    introducing fluorine into the compound semiconductor layer to form a fluorinated region, wherein introducing the fluorine comprises using etching equipment, wherein a top surface of the fluorinated region is level with a top surface of the compound semiconductor layer; and
    forming a gate over the compound semiconductor layer.

2. The method as claimed in claim 1, wherein introducing the fluorine comprises using reactive ion etching, inductively coupled plasma etching, or a combination thereof.

3. The method as claimed in claim 1, further comprising performing a first heat treatment after introducing the fluorine and before forming the gate.

4. The method as claimed in claim 1, further comprising performing a second heat treatment after forming the gate.

5. The method as claimed in claim 1, further comprising introducing the fluorine into the barrier layer around the compound semiconductor layer, wherein introducing the fluorine into the barrier layer around the compound semiconductor layer comprises using heating equipment, etching equipment, or a combination thereof.

6. The method as claimed in claim 1, further comprising:
    forming a first fluorine holding layer in situ during the formation of the compound semiconductor layer; and/or
    forming a second fluorine holding layer on a sidewall of the compound semiconductor layer after the formation of the compound semiconductor layer and before the formation of the gate, and the second fluorine holding layer extends between the source/drain pair and the channel layer.

7. The method as claimed in claim 6, further comprising the source/drain pair passing through the barrier layer and extending into the channel layer, and the second fluorine holding layer extending between the source/drain pair and the barrier layer.

8. The method as claimed in claim 6, further comprising:
forming an opening in the second fluorine holding layer over the compound semiconductor layer, and introducing the fluorine through the opening; and
forming a gate at the opening.

9. A method for forming semiconductor devices, comprising:
forming a channel layer over a substrate;
forming a barrier layer over the channel layer;
forming a compound semiconductor layer over the barrier layer;
forming a source/drain pair over the substrate, wherein the source and the drain are on opposite sides of the compound semiconductor layer;
introducing fluorine into the compound semiconductor layer to form a fluorinated region, wherein a top surface of the fluorinated region is level with a top surface of the compound semiconductor layer;
forming a gate over the compound semiconductor layer; and
performing a heat treatment after forming the gate.

10. The method as claimed in claim 9, wherein introducing the fluorine comprises using reactive ion etching, inductively coupled plasma etching, or a combination thereof.

11. The method as claimed in claim 9, further comprising introducing the fluorine into the barrier layer around the compound semiconductor layer, wherein introducing the fluorine into the barrier layer around the compound semiconductor layer comprises using heating equipment, etching equipment, or a combination thereof.

12. The method as claimed in claim 9, further comprising:
forming a first fluorine holding layer in situ during the formation of the compound semiconductor layer; and/or
forming a second fluorine holding layer on a sidewall of the compound semiconductor layer after the formation of the compound semiconductor layer and before the formation of the gate, and the second fluorine holding layer extends between the source/drain pair and the channel layer.

13. The method as claimed in claim 12, further comprising the source/drain pair passing through the barrier layer and extending into the channel layer, and the second fluorine holding layer extending between the source/drain pair and the barrier layer.

14. The method as claimed in claim 12, further comprising:
forming an opening in the second fluorine holding layer over the compound semiconductor layer, and introducing the fluorine through the opening; and
forming a gate at the opening.

15. A method for forming semiconductor devices, comprising:
forming a channel layer over a substrate;
forming a barrier layer over the channel layer;
forming a compound semiconductor layer over the barrier layer;
forming a source/drain pair over the substrate, wherein the source and the drain are on opposite sides of the compound semiconductor layer;
introducing fluorine into the compound semiconductor layer to form a fluorinated region, wherein a top surface of the fluorinated region is level with a top surface of the compound semiconductor layer;
performing a first heat treatment, and
forming a gate over the compound semiconductor layer, wherein performing the first heat treatment is after introducing the fluorine and before forming the gate.

16. The method as claimed in claim 15, further comprising performing a second heat treatment after forming the gate.

17. The method as claimed in claim 15, further comprising introducing the fluorine into the barrier layer around the compound semiconductor layer, wherein introducing the fluorine into the barrier layer around the compound semiconductor layer comprises using heating equipment, etching equipment, or a combination thereof.

18. The method as claimed in claim 15, further comprising:
forming a first fluorine holding layer in situ during the formation of the compound semiconductor layer; and/or
forming a second fluorine holding layer on a sidewall of the compound semiconductor layer after the formation of the compound semiconductor layer and before the formation of the gate, and the second fluorine holding layer extends between the source/drain pair and the channel layer.

19. The method as claimed in claim 18, further comprising the source/drain pair passing through the barrier layer and extending into the channel layer, and the second fluorine holding layer extending between the source/drain pair and the barrier layer.

20. The method as claimed in claim 18, further comprising:
forming an opening in the second fluorine holding layer over the compound semiconductor layer, and introducing the fluorine through the opening; and
forming a gate at the opening.

* * * * *